(12) United States Patent
Mochizuki

(10) Patent No.: US 8,188,457 B2
(45) Date of Patent: May 29, 2012

(54) LIGHT EMITTING DEVICE AND LAYERED LIGHT EMITTING DEVICE

(75) Inventor: Masamitsu Mochizuki, Fujimi (JP)

(73) Assignee: Seiko Epson Corporation (JP)

( * ) Notice: Subject to any disclaimer, the term of this patent is extended or adjusted under 35 U.S.C. 154(b) by 209 days.

(21) Appl. No.: 12/651,507

(22) Filed: Jan. 4, 2010

(65) Prior Publication Data

US 2010/0171137 A1    Jul. 8, 2010

(30) Foreign Application Priority Data

Jan. 6, 2009  (JP) .................. 2009-000782

(51) Int. Cl.
*H01L 29/06* (2006.01)

(52) U.S. Cl. ....... 257/13; 257/85; 257/93; 257/E33.001; 372/92; 372/95

(58) Field of Classification Search .................. None
See application file for complete search history.

(56) References Cited

U.S. PATENT DOCUMENTS

| | | | | |
|---|---|---|---|---|
| 5,088,105 A | * | 2/1992 | Scifres et al. | 372/92 |
| 5,097,479 A | * | 3/1992 | Opower | 372/95 |
| 6,803,604 B2 | * | 10/2004 | Takahashi et al. | 257/80 |
| 2006/0054899 A1 | | 3/2006 | Takahashi et al. | |
| 2011/0026108 A1 | | 2/2011 | Takahashi et al. | |

FOREIGN PATENT DOCUMENTS

| | | |
|---|---|---|
| JP | 11-64789 | 3/1999 |
| JP | 2000-244009 | 9/2000 |
| JP | 2001-111177 | 4/2001 |
| JP | 2007-219561 | 8/2007 |

* cited by examiner

*Primary Examiner* — Benjamin Sandvik
*Assistant Examiner* — Scott R Wilson
(74) *Attorney, Agent, or Firm* — Harness, Dickey & Pierce, P.L.C.

(57) ABSTRACT

A light emitting device includes a substrate, a first cladding layer, an active layer, and a second cladding layer formed in that order, and a reflective part formed above the substrate and separated from the active layer. At least a portion of the active layer constitutes a plurality of gain regions, which forms at least one gain region pair, a first gain region of which is provided in one direction and a second gain region is provided in another direction different from the one direction. At least a portion of an end surface of the first gain region and the second gain region overlap with each other. Light emitted from the end surface of the first gain region is reflected by the reflective part, and propagates in the same direction or in the focusing direction with light emitted from the end surface of the second gain region.

15 Claims, 6 Drawing Sheets

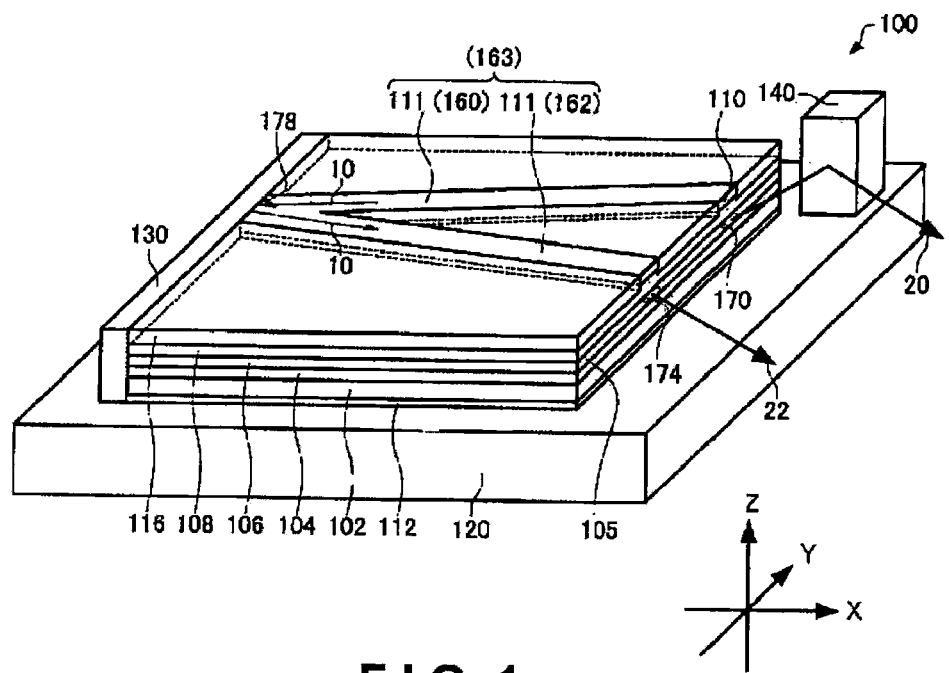
F I G. 1
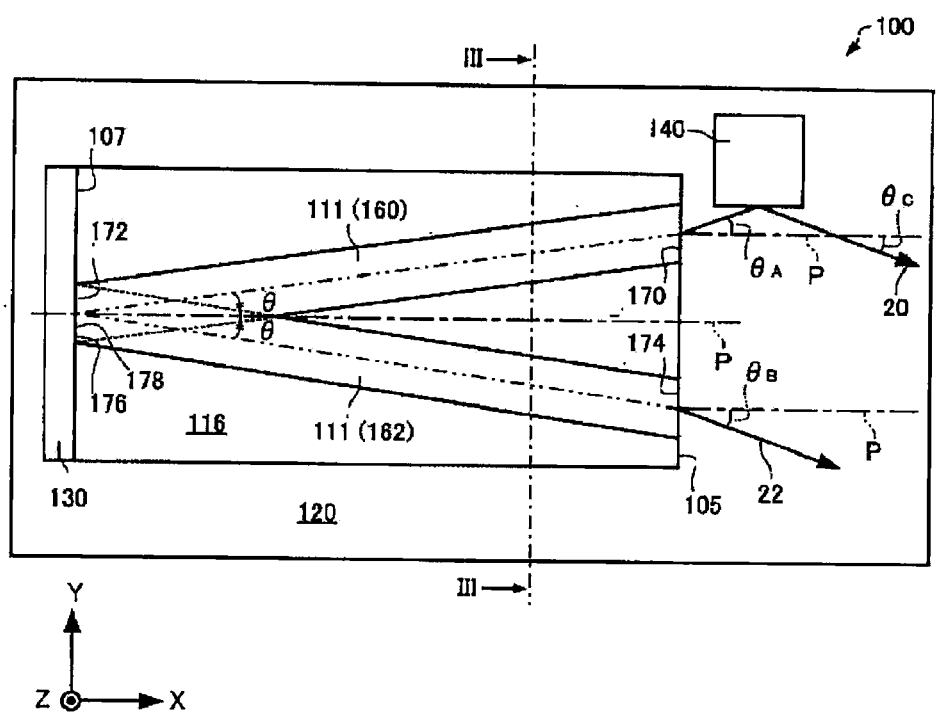
F I G. 2

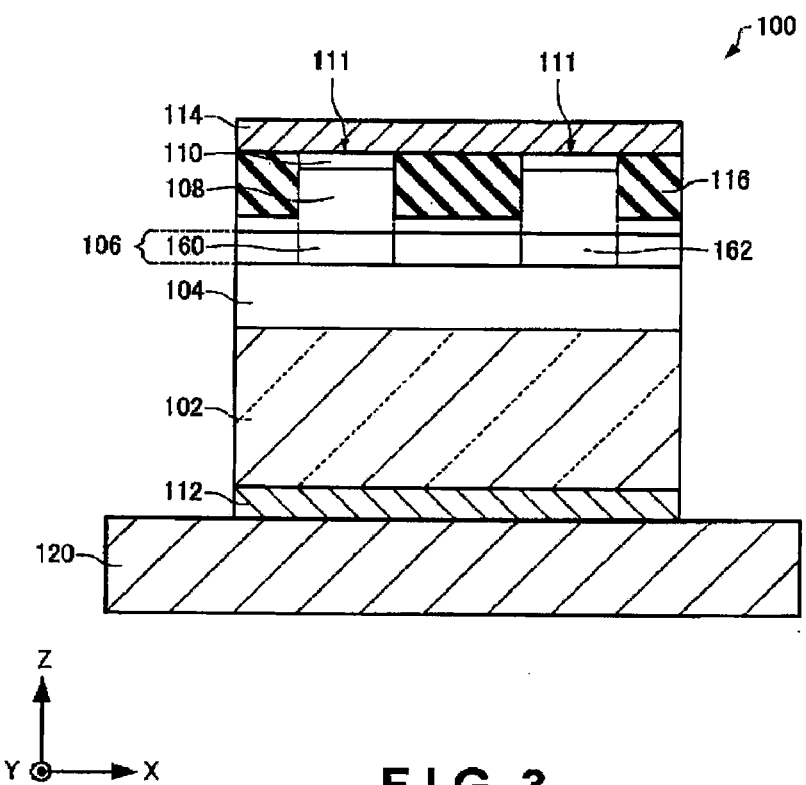
F I G. 3
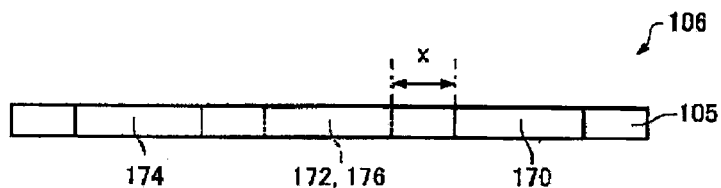
F I G. 4
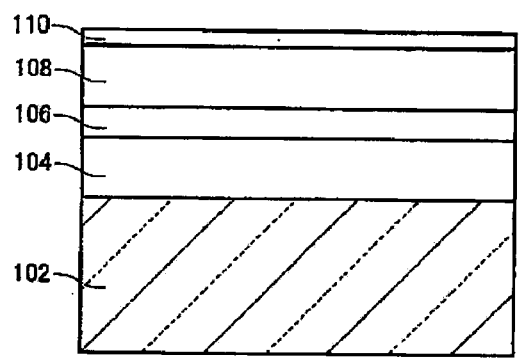
F I G. 5

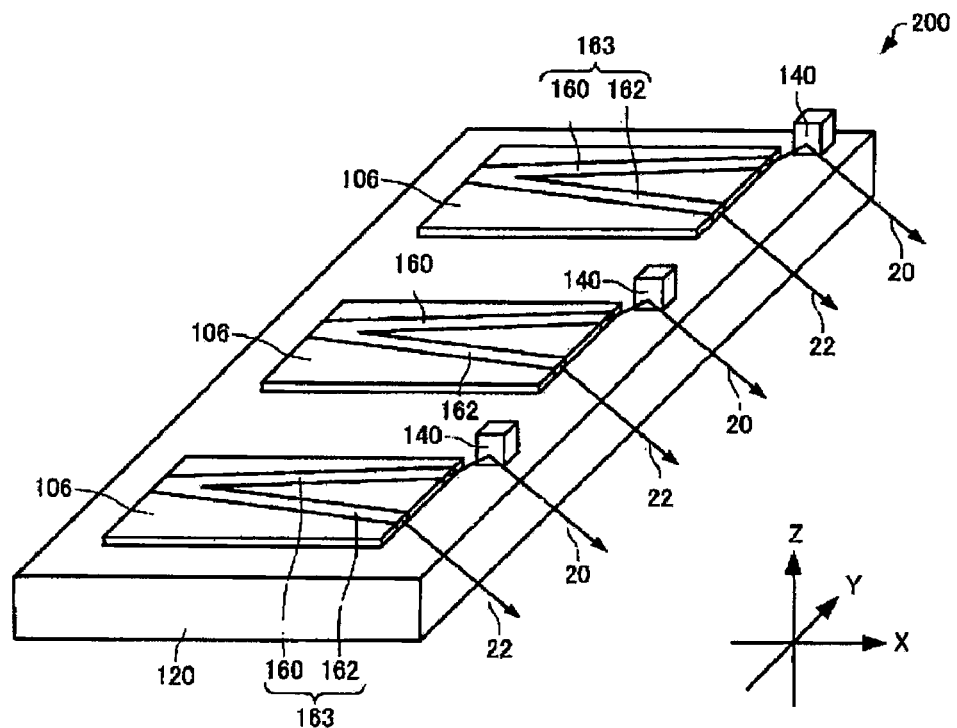
F I G. 8
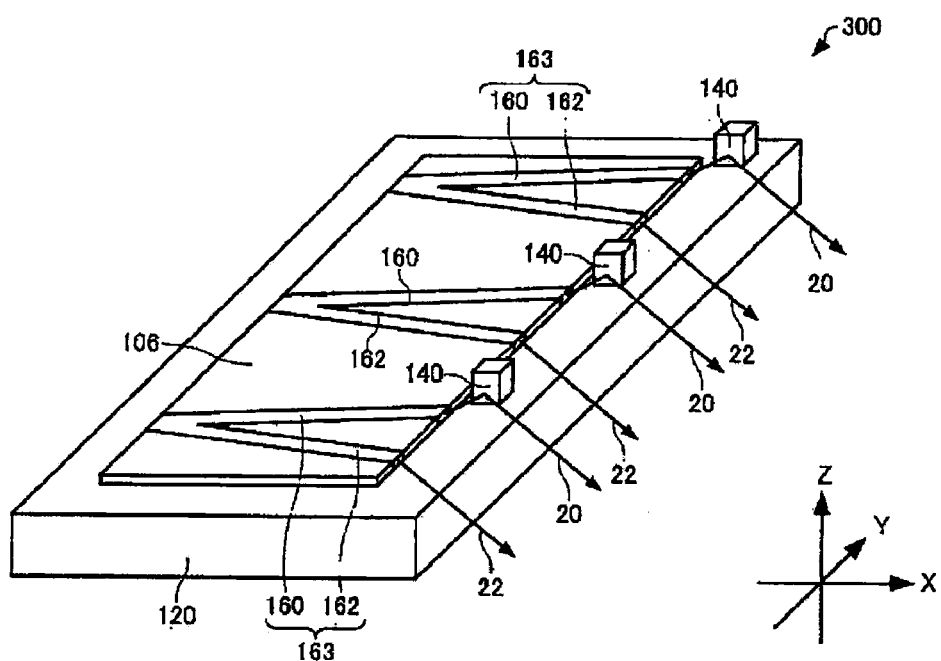
F I G. 9

LIGHT EMITTING DEVICE AND LAYERED LIGHT EMITTING DEVICE

CROSS-REFERENCE TO RELATED APPLICATIONS

This application claims priority to Japanese Patent Application No. 2009-000782 filed on Jan. 6, 2009. The entire disclosure of Japanese Patent Application No. 2009-000782 is hereby incorporated herein by reference.

BACKGROUND

1. Technical Field

The present invention relates to a light emitting device and to a layered light emitting device.

2. Related Art

Laser devices having high intensity and excellent color reproduction properties have been projected in recent years to be used as light emitting devices for use as light sources for projectors, displays, and other display devices. However, speckle noise that occurs through mutual interference of diffusely reflected light at the screen surface is sometimes problematic. In order to address this problem, a method has been proposed in Japanese Laid-Open Patent Publication No. 11-64789, for example, in which the screen is oscillated to vary the speckle pattern and thereby reduce the speckle noise.

SUMMARY

However, in the method disclosed in Japanese Laid-Open Patent Publication No. 11-64789, new problems sometimes occur, such as limitation of the screen, the need for a motor or other member for moving the screen, and background noise from the motor or the like.

A common LED (Light Emitting Diode) may also be used as the light emitting device for the light source in order to reduce speckle noise. However, adequate light output is sometimes not obtained from an LED.

An advantage of the present invention is to provide a novel light emitting device having high output and the capability of reducing speckle noise. Another advantage of the present invention is to provide a layered light emitting device that has the abovementioned light emitting device.

The light emitting device according to one aspect of the present invention includes a support part, a first cladding layer formed above the support part, an active layer formed above the first cladding layer, a second cladding layer formed above the active layer, and a reflective part formed above the support part and separated from the active layer. At least a portion of the active layer constitutes a plurality of gain regions. Each of the plurality of gain regions is provided at an angle with respect to a line normal to a first lateral surface of the active layer, from the first lateral surface to a second lateral surface of the active layer that is parallel to the first lateral surface. The plurality of gain regions forms at least one gain region pair. A first gain region that is one of the gain region pair is provided in one direction. A second gain region that is the other of the gain region pair is provided in another direction different from the one direction. At least a portion of an end surface of the first gain region, the end surface being located on the side of the second lateral surface, and at least a portion of an end surface of the second gain region, the end surface being located on the side of the second lateral surface, overlap with each other. Light emitted from the end surface of the first gain region, the end surface being located on the side of the first lateral surface, is reflected by the reflective part, and propagates in the same direction or in the focusing direction with light emitted from the end surface of the second gain region, the end surface being located on the side of the first lateral surface.

In the light emitting device according to one aspect of the present invention, laser oscillation of light generated by the gain regions can be suppressed or prevented, as described hereinafter. Speckle noise can therefore be reduced. Furthermore, in the light emitting device of the present invention, the light generated by the gain regions can propagate while being amplified within the gain regions, and be emitted to the outside. Consequently, a higher output than that of the conventional LED can be obtained. Through the present invention as described above, a novel light emitting device can be provided that has high output and the capability of reducing speckle noise.

In the description of the present invention, the wording "above" is used to denote that "a specific element (hereinafter referred to as 'B') is formed "above" another specific element (hereinafter referred to as 'A')," for example. In the description of the present invention, in a case such as the one illustrated by the example above, the wording "above" is used to include such cases as when B is formed directly on A, and such cases as when B is formed via another component on A.

In the light emitting device according to another aspect of the present invention, the material of the support part and the reflective part may be metal.

In the light emitting device according to another aspect of the present invention, the end surface of the first gain region, the end surface being located on the side of the second lateral surface, and the end surface of the second gain region, the end surface being located on the side of the second lateral surface, may be provided to the second lateral surface.

In the light emitting device according to another aspect of the present invention, the planar shape of the first gain region and the planar shape of the second gain region may be linearly symmetrical about a line normal to the first lateral surface.

In the light emitting device according to another aspect of the present invention, a configuration may be adopted in which the end surface on the side of the first lateral surface, and the end surface on the side of the second lateral surface in each of the plurality of gain regions do not overlap with each other as viewed in a plane from the first lateral surface.

In the light emitting device according to another aspect of the present invention, a configuration may be adopted in which at least a portion of the end surface of the first gain region, the end surface being located on the side of the second lateral surface, and at least a portion of the end surface of the second gain region, the end surface being located on the side of the second lateral surface, overlap with each other at overlapping surfaces; a portion of the light generated by the first gain region is reflected at the overlapping surfaces and is emitted from the end surface of the second gain region, the end surface being located on the side of the first lateral surface; and a portion of the light generated by the second gain region is reflected at the overlapping surfaces and is emitted from the end surface of the first gain region, the end surface being located on the side of the first lateral surface.

The light emitting device according to another aspect of the present invention may comprise a first electrode electrically connected to the first cladding layer; and a second electrode electrically connected to the second cladding layer.

In the description of the present invention, the wording "electrically connected" is used to describe a specific member (hereinafter referred to as 'member D') that is "electrically connected" to another specific member (hereinafter referred to as 'member C')," for example. In the description of the present invention, in a case such as the one illustrated by the example above, the wording "electrically connected" is used as including such cases as when member C and member D are directly contiguous with and electrically connected to each other, and such cases as when member C and member D are electrically connected via another member.

In the light emitting device according to another aspect of the present invention, a plurality of the gain region pairs may be arranged in a direction orthogonal to the thickness direction of the active layer.

In the layered light emitting device according to another aspect of the present invention, the light emitting device of the present invention may be arranged in a plural number in the thickness direction of the active layer.

In the layered light emitting device according to another aspect of the present invention, a configuration may be adopted in which a plurality of the gain region pairs of the light emitting device is arranged in a direction orthogonal to the thickness direction of the active layer, a plurality of the gain region pairs of the light emitting device is arranged in the thickness direction of the active layer, and electric current is fed independently to each row comprising a plurality of the gain region pairs arranged in the thickness direction of the active layer.

In the layered light emitting device according to another aspect of the present invention, the reflective parts of the plurality of light emitting devices may be continuous.

BRIEF DESCRIPTION OF THE DRAWINGS

Referring now to the attached drawings which form a part of this original disclosure:

FIG. 1 is a schematic perspective view showing the light emitting device according to the first embodiment;

FIG. 2 is a schematic perspective view showing the light emitting device according to the first embodiment;

FIG. 3 is a schematic perspective view showing the light emitting device according to the first embodiment;

FIG. 4 is a plan view showing the active layer according to the first embodiment from the side of the first lateral surface;

FIG. 5 is a schematic sectional view showing the steps for manufacturing the light emitting device of the first embodiment;

FIG. 8 is a schematic perspective view showing the light emitting device according to a first modification of the first embodiment;

FIG. 9 is a schematic perspective view showing the light emitting device according to a second modification of the first embodiment;

DETAILED DESCRIPTION OF EXEMPLARY EMBODIMENTS

Figure 6:
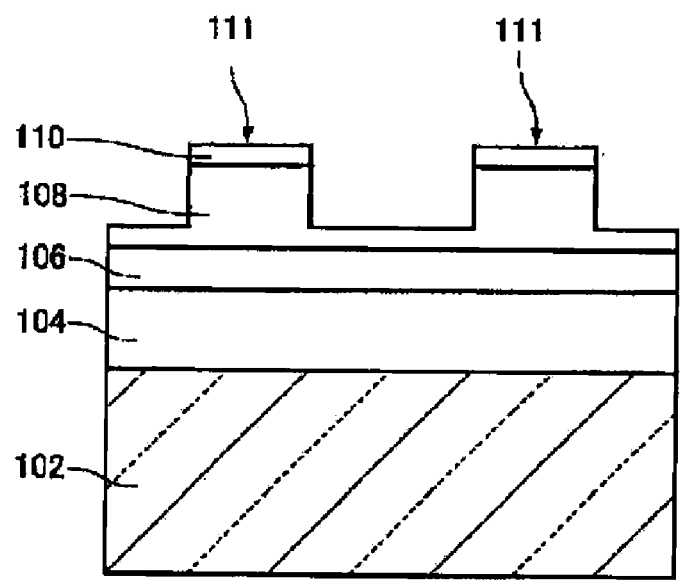
FIG. 6 is a schematic sectional view showing the steps for manufacturing the light emitting device of the first embodiment.

Preferred embodiments of the present invention will be described hereinafter with reference to the drawings.

1. First Embodiment 1.1. Light Emitting Device According to a First Embodiment

The light emitting device 100 according to a first embodiment will first be described with reference to the drawings. FIG. 1 is a schematic perspective view showing the light emitting device 100. FIG. 2 is a schematic plan view showing the light emitting device 100. FIG. 3 is a schematic sectional view along line III-III of FIG. 2 showing the light emitting device 100. The second electrode 114 is omitted in FIGS. 1 and 2 for the sake of convenience. A case is described in which the light emitting device 100 is an InGaAlP-type (red) semiconductor device.

As shown in FIGS. 1 through 3, the light emitting device 100 includes a support part 120, a first cladding layer 104, an active layer 106, a second cladding layer 108, and a reflective part 140. The light emitting device 100 may further include a substrate 102, a contact layer 110, an insulation part 116, a first electrode 112, a second electrode 114, and a reflective film 130.

The material of the support part 120 is metal, for example, and more specifically, gold, copper, aluminum, or another metal. The support part 120 is electrically conductive, for example.

The substrate 102 is formed on the support part 120. A GaAs substrate of a first conduction type (e.g., n-type) or the like, for example, may be used as the substrate 102.

The first cladding layer 104 is formed on the substrate 102. An n-type AlGaP layer or the like, for example, may be used as the first cladding layer 104. Although not shown in the drawing, a buffer layer may be formed between the first substrate 102 and the first cladding layer 104. An n-type GaAs layer, InGaP layer, or the like, for example, may be used as the buffer layer.

The active layer 106 is formed on the first cladding layer 104. The active layer 106 has a multiple quantum well (MQW) structure in which three quantum well structures composed of an InGaP well layer and an InGaAlP barrier layer are stacked, for example.

A portion of the active layer 106 constitutes a plurality of gain regions. Each of the plurality of gain regions is paired. For example, in the example shown in the drawing, the active layer 106 has two gain regions (first gain region 160 and second gain region 162), and these gain regions constitute a gain region pair 163.

The gain regions 160, 162 are capable of generating light, and this light can be amplified within the gain regions 160, 162. The active layer 106 may have a rectangular (including cuboid) or other shape. As shown in FIG. 2, the active layer 106 has a first lateral surface 105 and a second lateral surface 107. The first lateral surface 105 and second lateral surface 107 are parallel to each other. The reflectance of the second lateral surface 107 is higher than the reflectance of the first lateral surface 105 in the wavelength band of light generated by the gain regions 160, 162. For example, as shown in FIGS. 1 and 2, the second lateral surface 107 is covered by the reflective film 130, and high reflectance can thereby be obtained. The reflective film 130 is a dielectric multilayer film minor, for example. Specifically, a mirror in which ten pairs of an $SiO_2$ layer and a $Ta_2O_5$ layer are layered in sequence from the side of the second lateral surface 107, for example, may be used as the reflective film 130. The reflectance of the second lateral surface 107 is preferably 100% or nearly 100%. In contrast, the reflectance of the first lateral surface 105 is preferably 0% or nearly 0%. Low reflectance can be obtained by covering the first lateral surface 105 with an antireflective film (not shown), for example. The reflective film 130 is not limited to the examples described above, and an $Al_2O_3$ layer, a $TiO_2$ layer, an SiN layer, or a multilayer film composed of these layers, for example, can be used as the reflective film 130.

Each of the gain regions 160, 162 is provided at an angle with respect to a normal line P drawn to the first lateral surface 105 from the first lateral surface 105 to the second lateral surface 107, as viewed in a plane as shown in FIG. 2. Laser oscillation of the light generated by the gain regions 160, 162 can thereby be suppressed or prevented. The first gain region 160 and the second gain region 162 are provided in mutually different directions. In the example shown in the drawing, the first gain region 160 is tilted in one direction with respect to the normal line P, and is provided in one direction having a tilt of angle θ. The second gain region 162 is tilted toward the other side (the opposite side from the direction described above) with respect to the normal line P, and is provided in the other direction having a tilt of angle θ. To describe the first gain region 160 as being provided on one direction means that this one direction coincides with the direction that connects the center of a first end surface 170 of the first gain region 160, the first end surface being located on the side of the first lateral surface 105, with the center of a second end surface 172 on the side of the second lateral surface 107, as viewed in a plane. The same applies for the other gain region.

The first end surface 170 of the first gain region 160, the first end surface being located on the side of the first lateral surface 105, and a third end surface 174 of the second gain region 162, the third end surface being located on the side of the first lateral surface 105, are provided to the first lateral surface 105. The second end surface 172 of the first gain region 160, the second end surface being located on the side of the second lateral surface 107, and a fourth end surface 176 of the second gain region 162, the fourth end surface being located on the side of the second lateral surface 107, are provided to the second lateral surface 107. In the example shown in the drawing, the second end surface 172 and the fourth end surface 176 are completely overlapped with each other at an overlapping surface 178. The planar shape of the first gain region 160 and the planar shape of the second gain region 162 are linearly symmetrical about the normal line P in the second end surface 172 or fourth end surface 176, for example. The planar shape of the first gain region 160 and the planar shape of the second gain region 162 are linearly symmetrical about the perpendicular bisector P of the overlapping surface 178, for example. The planar shape of each of the first gain region 160 and second gain region 162 is a parallelogram or the like such as shown in FIG. 2, for example.

Although not shown in the drawing, the second end surface 172 and fourth end surface 176 may be provided to an opening formed in the active layer 106, for example, rather than to the lateral surface of the active layer 106.

FIG. 4 is a view showing the active layer 106 in a plane as viewed from the side of the first lateral surface 105. As shown in FIG. 4, the first end surface 170 and second end surface 172 of the first gain region 160 do not overlap. Likewise, the third end surface 174 and fourth end surface 176 of the second gain region 162 do not overlap. The light generated by the first gain region 160 thereby cannot be directly caused to undergo multiple reflection between the first end surface 170 and the second end surface 172, and the light generated by the second gain region 162 cannot be caused to undergo multiple reflection between the third end surface 174 and the fourth end surface 176. As a result, since the creation of a direct resonator can be prevented, laser oscillation of the light generated by the gain regions 160, 162 can be more reliably suppressed or prevented. Consequently, the light emitting device 100 is capable of generating non-laser light. In this case, as shown, for example, in FIG. 4, the offset width×between the first end surface 170 and the second end surface 172 in the first gain region 160 may be any positive value.

The second cladding layer 108 is formed on the active layer 106, as shown in FIGS. 1 and 3. An AlGaP layer of a second conduction type (e.g., p-type) or the like, for example, may be used as the second cladding layer 108.

For example, a pin diode may be configured from a p-type second cladding layer 108, the active layer 106 not doped with an impurity, and an n-type first cladding layer 104. Each of the first cladding layer 104 and the second cladding layer 108 is a layer having a larger forbidden band width and a smaller refractive index than the active layer 106. The active layer 106 has the function of amplifying light. The first cladding layer 104 and second cladding layer 108 lie on both sides of the active layer 106 and have the function of blocking in injection carriers (electrons and positive holes) and light.

In the light emitting device 100, recombination of electrons and positive holes occurs in the gain regions 160, 162 of the active layer 106 when a forward bias of the pin diode is applied across the first electrode 112 and second electrode 114. Light is generated by this recombination. The generated light originates from a chain of stimulated emissions, and the intensity of the light is amplified within the gain regions 160, 162. For example, as shown in FIG. 1, a portion 10 of the light generated by the first gain region 160 is amplified inside the first gain region 160 and is then reflected at the overlapping surface 178 and emitted as emitted light beam 22 from the third end surface 174 of the second gain region 162, but the light intensity is amplified in the second gain region 162 as well after reflection. In the same manner, a portion of the light generated by the second gain region 162 is amplified inside the second gain region 162 and is then reflected at the overlapping surface 178 and emitted as an emitted light beam 20 from the first end surface 170 of the first gain region 160, but the light intensity is amplified in the second gain region 162 as well after reflection. Some of the light generated by the first gain region 160 is emitted as a light beam 20 emitted directly from the first end surface 170. In the same manner, some of the light generated by the second gain region 162 is emitted light beam 22 emitted directly from the third end surface 174. These portions of light are amplified in the gain regions in the same manner.

As shown in FIGS. 1 and 2, the reflective part 140 is formed on the support part 120 so as to be separated from the active layer 106. The reflective part 140 is formed on the side of the first lateral surface 105, for example. The material of the reflective part 140 is metal, for example, and more specifically, gold, copper, aluminum, or another metal. The reflective part 140 is made of the same material as the support part 120, for example. The light beam 20 emitted from the first end surface 170 is reflected by the reflective part 140, and can propagate in the same direction or in the focusing direction with the light beam 22 emitted from the third end surface 174. More specifically, as shown in FIG. 2, the light beam 20 is emitted in a direction that is tilted $θ_A$ with respect to the normal line P from the first end surface 170, and the light beam 22 is emitted in a direction that is tilted $θ_B$ with respect to the normal line P from the third end surface 174. If it is assumed that the light beam 20 emitted from the first end surface 170 is reflected by the reflective part 140 and is propagated in a direction that is tilted $θ_C$ with respect to the normal line P, then $θ_C$ is equal to or greater than $θ_B$. The angles $θ_A$, $θ_B$, and $θ_C$ are smaller than 90 degrees. The angles $θ_A$, $θ_B$, and $\theta_C$ are all equal to each other, for example. Almost all of the light beam 20 can be reflected by the reflective part 140.

The contact layer 110 is formed on the second cladding layer 108, as shown in FIGS. 1 and 3. A layer in ohmic contact with the second electrode 114 can be used as the contact layer 110. A p-type GaAs layer or the like, for example, can be used as the contact layer 110.

The contact layer 110 and a portion of the second cladding layer 108 can form columnar parts 111. The planar shape of the columnar parts 111 is the same as that of the gain regions 160, 162, as shown in FIG. 2, for example. Specifically, the current path between the electrodes 112, 114 is determined by the planar shape of the columnar parts 111, for example, and as a result, the planar shape of the gain regions 160, 162 is determined. Although not shown in the drawings, the columnar parts 111 can also be composed of the contact layer 110, a portion of the second cladding layer 108, a portion of the active layer 106, and a portion of the first cladding layer 104, for example. The lateral surfaces of the columnar parts 111 can also be tilted.

The insulation part 116 can be provided on the second cladding layer 108 laterally to the columnar parts 111, as shown in FIGS. 1 and 3. The insulation part 116 can be contiguous with a lateral surface of the columnar parts 111. The upper surface of the insulation part 116 is continuous with the upper surface of the contact layer 110, for example. An SiN layer, $SiO_2$ layer, polyimide layer, or other layer, for example, can be used as the insulation part 116. When these materials are used as the insulation part 116, the current between the electrodes 112, 114 avoids the insulation part 116 and can flow through the columnar parts 111 bordered on both sides by the insulation part 116. For example, the insulation part 116 makes the refractive index of the active layer 106 below the insulation part 116 smaller than the refractive index of the active layer 106 below the columnar parts 111. Light can thereby be efficiently kept within the active layer 106. A configuration may also be adopted in which the insulation part 116 is not provided. The insulation part 116 may also be interpreted as being air. In this case, a configuration must be adopted in which the active layer 106 and the first cladding layer 104 are not included in the columnar parts 111, or in which the second electrode 114 does not directly contact the active layer 106 and the first cladding layer 104.

The first electrode 112 is formed on the entire lower surface of the substrate 102. The first electrode 112 can be contiguous with a layer (substrate 102 in the example shown in the drawing) in ohmic contact with the first electrode 112. The first electrode 112 is electrically connected to the first cladding layer 104 via the substrate 102. The first electrode 112 is one of the electrodes for driving the light emitting device 100. An electrode in which a Cr layer, an AuGe layer, a Ni layer, and an Au layer are layered in sequence from the substrate 102, for example, can be used as the first electrode 112. A configuration may also be adopted in which a second contact layer (not shown) is provided between the first cladding layer 104 and the substrate 102, the second contact layer is exposed by dry etching or the like, and the first electrode 112 is provided on the second contact layer. A single-sided electrode structure can thereby be obtained. This arrangement is particularly effective when the substrate 102 is an insulator.

The second electrode 114 can be formed on the entire surface of the contact layer 110 and insulation part 116, as shown in FIG. 3. Although not shown in the drawing, when the active layer 106 alone, or both the active layer 106 and first cladding layer 104, are included, and the insulation part 116 is not provided, the columnar parts 111 are preferably formed in localized fashion only on the contact layer 110 (columnar parts 111), for example, so that there is no direct electrical connection between the second electrode 114 and the active layer 106 or first cladding layer 104. The second electrode 114 is electrically connected to the second cladding layer 108 via the contact layer 110. The second electrode 114 is the other electrode for driving the light emitting device 100. An electrode in which a Cr layer, an AuZn layer, and an Au layer are layered in sequence from the contact layer 110, for example, can be used as the second electrode 114. The surface of contact between the second electrode 114 and the contact layer 110 has the same planar shape as the gain regions 160, 162, as shown in FIG. 2.

An index-guide-type light emitting device in which a refractive index distribution is provided within the active layer 106 to block in light was described as an example of the light emitting device 100 of the present embodiment, but the light emitting device 100 may also be a gain-guided-type light emitting device in which a refractive index distribution is not provided within the active layer 106, and the gain regions 160, 162 act as waveguide regions.

An InGaAlP-type light emitting device was described as an example of the light emitting device 100 of the present embodiment, but any material from which a light emitting gain region can be formed may be used in the light emitting device 100. Examples of semiconductor materials that can be used include AlGaN, InGaN, GaAs, InGaAs, GaInNAs, ZnCdSe, and other semiconductor materials.

The light emitting device 100 of the present embodiment can be used as the light source of a projector, display, illumination device, measurement device, or the like, for example.

The light emitting device 100 of the present embodiment has the following characteristics, for example.

In the light emitting device 100, laser oscillation of light generated by the gain regions 160, 162 can be suppressed or prevented, as described above. Speckle noise can therefore be reduced. Furthermore, in the light emitting device 100, the light generated by the gain regions 160, 162 can propagate while being amplified within the gain regions 160, 162, and be emitted to the outside. Consequently, a higher output than that of the conventional LED can be obtained. Through the present embodiment as described above, a novel light emitting device can be provided that has high output and the capability of reducing speckle noise.

In the light emitting device 100, the light beam 20 emitted from the first end surface 170 can be reflected by the reflective part 140 and propagated in the same direction or in the focusing direction with the light beam 22 emitted from the third end surface 174. An optical system (optical system that receives the emitted light beams 20, 22) not shown in the drawings can thereby be reduced in size relative to a case in which two emitted light beams propagate in divergent directions.

In the light emitting device 100, a portion 10 of the light generated by the first gain region 160 is reflected at the overlapping surface 178, and can propagate while being amplified within the second gain region 162 as well. The same applies for a portion of the light generated by the second gain region 162. Consequently, in the light emitting device 100, since the distance over which the light intensity is amplified is increased relative to a case in which no reflection ultimately occurs at the overlapping surface 178, high light output can be obtained.

1.2. Method for Manufacturing the Light Emitting Device of the First Embodiment

Figure 7:
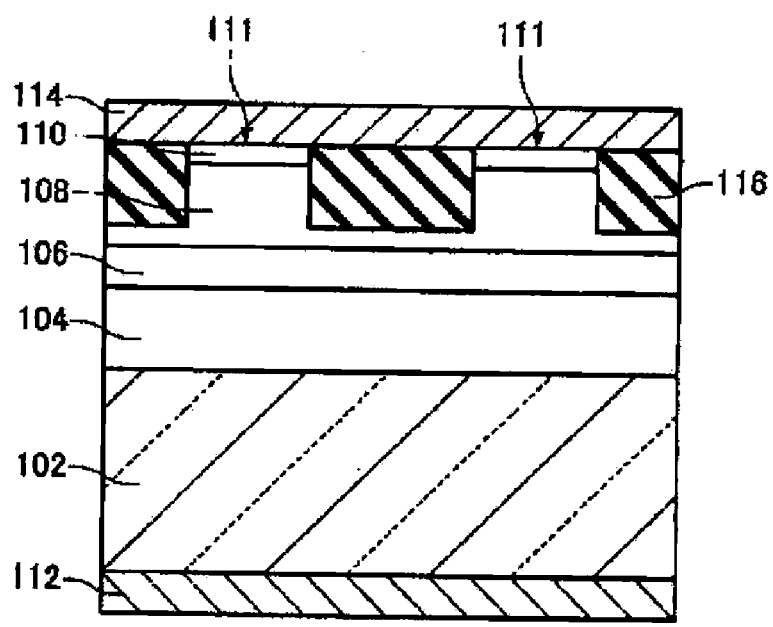
FIG. 7 is a schematic sectional view showing the steps for manufacturing the light emitting device of the first embodiment.

A method for manufacturing the light emitting device 100 of the first embodiment will next be described with reference to the drawings. FIGS. 5 through 7 are schematic sectional views corresponding to FIG. 3 and showing the steps for manufacturing the light emitting device 100.

As shown in FIG. 5, the first cladding layer 104, the active layer 106, the second cladding layer 108, and the contact layer 110 are formed in sequence on the substrate 102 by epitaxial growth. Examples of epitaxial growth methods that can be used include MOCVD (Metal Organic Chemical Vapor Deposition), MBE (Molecular Beam Epitaxy), and the like.

The contact layer 110 and the second cladding layer 108 are patterned as shown in FIG. 6. A photolithography technique, etching technique, or other technique, for example, is used in patterning. The columnar parts 111 can be formed by this step.

As shown in FIG. 7, the insulation part 116 is formed so as to cover the lateral surfaces of the columnar parts 111. Specifically, an insulation layer (not shown) is first formed above the second cladding layer 108 (including on the contact layer 110) by CVD (Chemical Vapor Deposition), coating application, or another method, for example. The upper surface of the contact layer 110 is then exposed by an etching technique or the like, for example. The insulation part 116 can be formed by the process described above.

The second electrode 114 is then formed on the contact layer 110 and insulation part 116. The second electrode 114 is formed by vacuum deposition, for example.

The first electrode 112 is then formed below the lower surface of the substrate 102. The method for fabricating the first electrode 112 is the same as the method described above for fabricating the second electrode 114, for example. The sequence in which the first electrode 112 and the second electrode 114 are formed is not particularly limited.

The reflective film 130 is formed on the entire second lateral surface 107, as shown in FIGS. 1 and 2. The reflective film 130 is formed by CVD, sputtering, ion assisted deposition, or another method, for example.

The support part 120 and the reflective part 140 are then formed. The support part 120 and the reflective part 140 can be formed simultaneously by molding, for example.

The layered assembly formed by the steps described above is then packaged on the support part 120. Packaging is performed using silver paste or the like, for example.

The light emitting device 100 can be manufactured by the steps described above.

Through the method for manufacturing the light emitting device 100, a novel light emitting device can be obtained that has high output and the capability of reducing speckle noise.

1.3 Light Emitting Device According to a First Modification of the First Embodiment The light emitting device 200 according to a first modification of the first embodiment will next be described with reference to the drawings. FIG. 8 is a schematic perspective view showing the light emitting device 200. The same reference numerals are used to refer to members of the light emitting device 200 according to the first modification of the first embodiment that have the same functions as constituent members of the light emitting device 100 of the first embodiment, and no detailed description thereof will be given. The substrate 102, first cladding layer 104, second cladding layer 108, contact layer 110, first electrode 112, second electrode 114, insulation part 116, and reflective film 130 are omitted from FIG. 8 for the sake of convenience.

In the light emitting device 200, a plurality of active layers 106 is arranged, and a plurality of gain region pairs 163 is arranged as shown in FIG. 8. A plurality of active layers 106 is arranged in the direction (Y direction) orthogonal to the thickness direction (Z direction) of the active layers. Three active layers 106 are provided in the example shown, but this number is not particularly limited. A reflective part 140 may be provided for each of the plurality of active layers 106 in corresponding fashion, and a plurality of light beams 20 and plurality of light beams 22 may propagate in the same direction, for example.

In the light emitting device 200, the plurality of light beams 20 and plurality of light beams 22 may be caused to propagate in the same direction by the reflective parts 140. Specifically, the output of the light emitting device as a whole can be increased in the light emitting device 200 relative to the light emitting device 100.

1.4. Light Emitting Device According to a Second Modification of the First Embodiment The light emitting device 300 according to a second modification of the first embodiment will next be described with reference to the drawings. FIG. 9 is a schematic perspective view showing the light emitting device 300. The same reference numerals are used to refer to members of the light emitting device 300 according to the second modification of the first embodiment that have the same functions as constituent members of the light emitting device 100 of the first embodiment, and no detailed description thereof will be given. The substrate 102, first cladding layer 104, second cladding layer 108, contact layer 110, first electrode 112, second electrode 114, and insulation part 116 are omitted from FIG. 9 for the sake of convenience.

In the light emitting device 300, a plurality of gain region pairs 163 is provided within a single active layer 106. Three gain region pairs 163 are provided in the example shown, but this number is not particularly limited. A plurality of gain region pairs 163 is arranged in the direction (Y direction) orthogonal to the thickness direction (Z direction) of the active layer 106. A reflective part 140 may be provided for each of the plurality of gain region pairs 163 in corresponding fashion, and a plurality of light beams 20 and plurality of light beams 22 may propagate in the same direction, for example.

In the light emitting device 300, the plurality of light beams 20, 22 can be made to propagate in the same direction without packaging a plurality of active layers 106 (layered assembly including the active layers 106), as in the light emitting device 200. Therefore, since the number of times that a layered assembly that includes the active layers 106 is packaged is reduced in the light emitting device 300 relative to the light emitting device 200, the potential for misalignment in packaging can be correspondingly reduced.

In the light emitting device 300, the plurality of light beams 20, 22 can be easily and efficiently made to propagate in the same direction by the reflective parts 140. Specifically, although not shown in the drawing, when the light is reflected by a cleaved surface, for example, a cleaved surface must be formed for each of the plurality of gain regions, and it can be difficult to cause the plurality of light to propagate in the same direction. Although not shown in the drawings, when an open part is formed in the active layer by an etching technique or the like, and light is reflected by the open part, for example, the surface of the open part has significant irregularities in comparison to a cleaved surface, for example, and loss of light can occur when the light is reflected. Such a problem does not occur in the light emitting device 300.

In the example shown in the first embodiment, the gain region means current route which electric current avoids the insulation part and flows from the first cladding layer to the second cladding layer through the active layer. To put it in other words, the light emitting device comprising:
  an active layer formed between a first cladding layer and a second cladding layer;
  a reflective part separated from the active layer;

a support part supporting the reflective part;
a pair of electrodes to pass current from the first cladding layer to the second cladding layer; and
insulation part regulating the current flow;
wherein
at least a portion of the active layer constitutes two of current routes defined by electric current avoids the insulation part and flows from the first cladding layer to the second cladding layer through the active layer;
the two of current routes composed of a first region and a second region;
each of the first region and the second region is provided at an angle with respect to a line normal to a first lateral surface of the active layer, from the first lateral surface to a second lateral surface of the active layer that is parallel to the first lateral surface;
the first region is provided in one direction;
the second region is provided in another direction different from the one direction;
at least a portion of an end surface of the first region, the end surface being located on the side of the second lateral surface, and at least a portion of an end surface of the second region, the end surface being located on the side of the second lateral surface, overlap with each other; and
light emitted from the end surface of the first region, the end surface being located on the side of the first lateral surface, is reflected by the reflective part, and propagates in the same direction or in the focusing direction with light emitted from the end surface of the second region, the end surface being located on the side of the first lateral surface.

Figure 10:
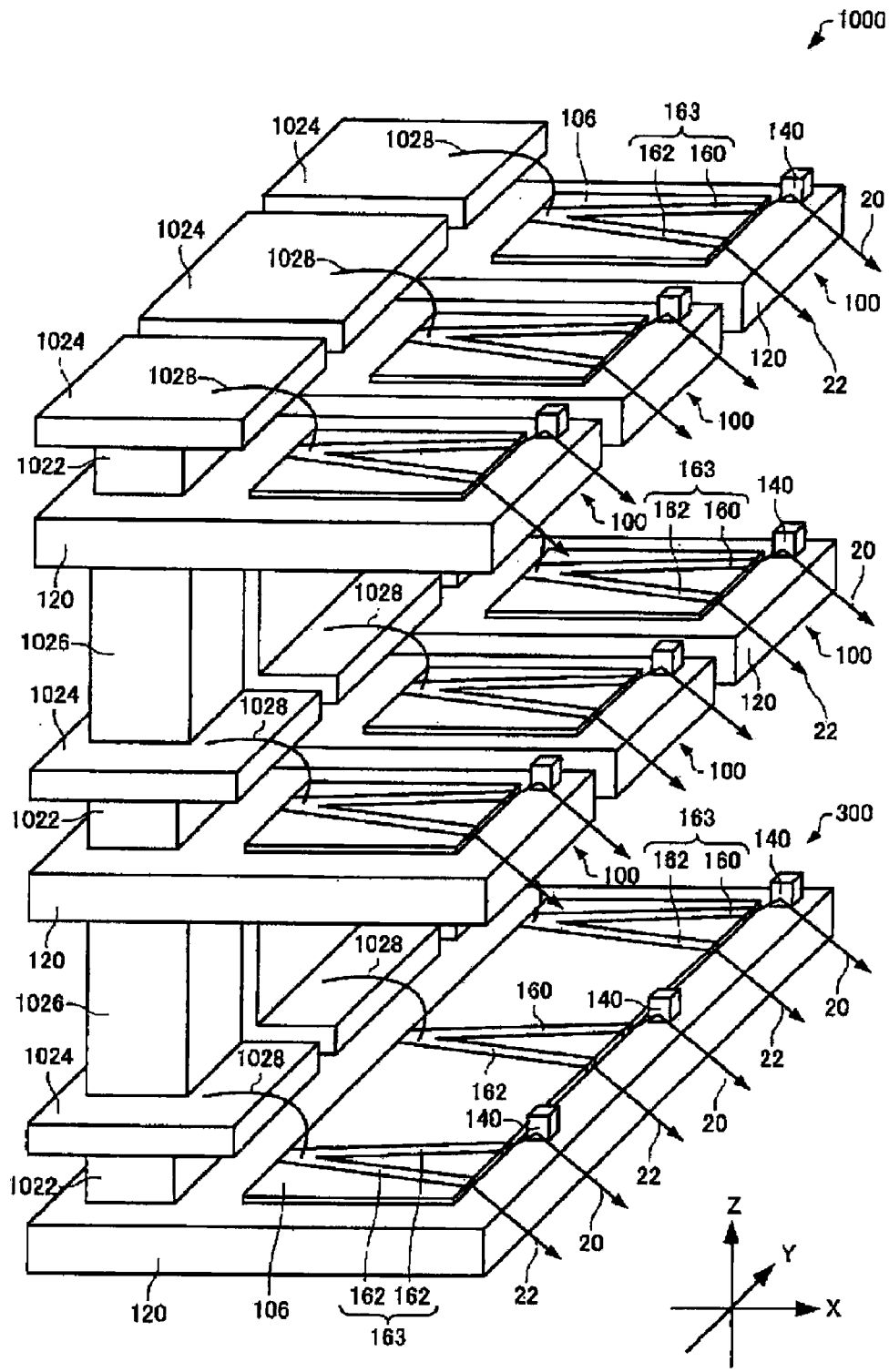
FIG. 10 is a schematic perspective view showing the light emitting device according to the second embodiment.

2. Second Embodiment 2.1. Layered Light Emitting Device of the Second Embodiment The layered light emitting device 1000 of the second embodiment will next be described with reference to the drawings. FIG. 10 is a schematic perspective view showing the layered light emitting device 1000. The same reference numerals are used to refer to members of the layered light emitting device 1000 according to the second embodiment that have the same functions as constituent members of the light emitting device 100 of the first embodiment, and no detailed description thereof will be given. The substrate 102, first cladding layer 104, second cladding layer 108, contact layer 110, first electrode 112, second electrode 114, and insulation part 116 are omitted from FIG. 10 for the sake of convenience.

The layered light emitting device 1000 may have the light emitting devices 100, 300 of the present invention, first members 1022, second members 1024, third members 1026, and wires 1028, as shown in FIG. 10.

The light emitting device of the present invention is arranged in a plural number in the thickness direction (Z direction) of the active layer 106. In the example shown in the drawing, the light emitting devices of the present invention are in a three-tier structure in which three light emitting devices are arranged in the Z direction, but the number of light emitting devices is not particularly limited.

The light emitting device 300 described above is formed on the first level in the example shown in the drawing. In the light emitting device 300, three gain region pairs 163 are arranged in the direction (Y direction) orthogonal to the thickness direction of the active layer 106. In the light emitting device 300, the first electrode 112 (not shown) and the support part 120 are electrically connected, and the support part 120 is connected to the ground, for example.

In the example shown in the drawing, the light emitting device 100 described above is formed above each of the gain region pairs 163 of the light emitting device 300 of the first level. Specifically, three light emitting devices 100 are arranged in the Y direction in the second level of the layered light emitting device 1000. The support parts 120 of the light emitting devices 100 of the second level are not necessarily contiguous with each other.

In the example shown in the drawing, the light emitting device 100 described above is formed above each of the gain region pairs 163 of the light emitting device 100 of the second level. Specifically, three light emitting devices 100 are arranged in the Y direction in the third level of the layered light emitting device 1000. The support parts 120 of the light emitting devices 100 of the third level are not necessarily contiguous with each other.

As described above, a plurality of gain region pairs 163 is arranged in the Z direction in the layered light emitting device 1000, and a plurality of rows of the plurality of gain region pairs 163 arranged in the Z direction is arranged in the Y direction.

The first members 1022 are formed on the support parts 120 of the light emitting devices of each level. The first members 1022 may, for example, have insulating properties.

The second members 1024 are formed on the first members 1022 so as to correspond to each of the plurality of gain region pairs 163 of each level. In the example shown in the drawing, three second members 1024 are arranged in the Y direction in each level. The material used to form the second members 1024 is the same as that of the support parts 120, for example. The second members 1024 may, for example, be electroconductive. The second members 1024 located on the same level are not electrically connected to each other. Specifically, the second members 1024 arranged in the Y direction are not contiguous with each other. The second members 1024 located in the same row are electrically connected by wiring (not shown), and the wiring can be electrically connected with a power supply unit (not shown), for example. Specifically, the second members 1024 arranged in the Z direction are electrically connected to each other.

The third members 1026 are formed on the second members 1024 (although not on the second members 1024 of the third level in the example shown in the drawing). The material used to form the third members 1026 is the same as that of the support parts 120, for example. The third members 1026 may, for example, be electroconductive. The third members 1026 located on the same level are not electrically connected to each other. Specifically, the third members 1026 arranged in the Y direction are not contiguous with each other.

The wires 1028 electrically connect the second electrode 114 (not shown) and the second members 1024 with each other. The wires 1028 are composed of gold, silver, or the like, for example.

Although not shown in the drawing, the layered light emitting device 1000 may have a heat pipe. The heat pipe may be connected to a heat sink or Peltier element not shown in the drawing. The heat dissipation properties of the layered light emitting device 1000 can be enhanced by a heat pipe.

In the layered light emitting device 1000, an electric current can be fed independently for each row composed of the plurality of gain region pairs 163 arranged in the Z direction, as described above. Through this configuration, when more heat is generated by a row composed of gain region pairs 163 positioned in the center than by a row composed of gain region pairs 163 positioned at an end, the row positioned in the center can be driven by a higher current. Specifically, current compensation can be performed for each row. The density of emitted light of the layered light emitting device 1000 as a whole can thereby be made uniform.

Figure 11:
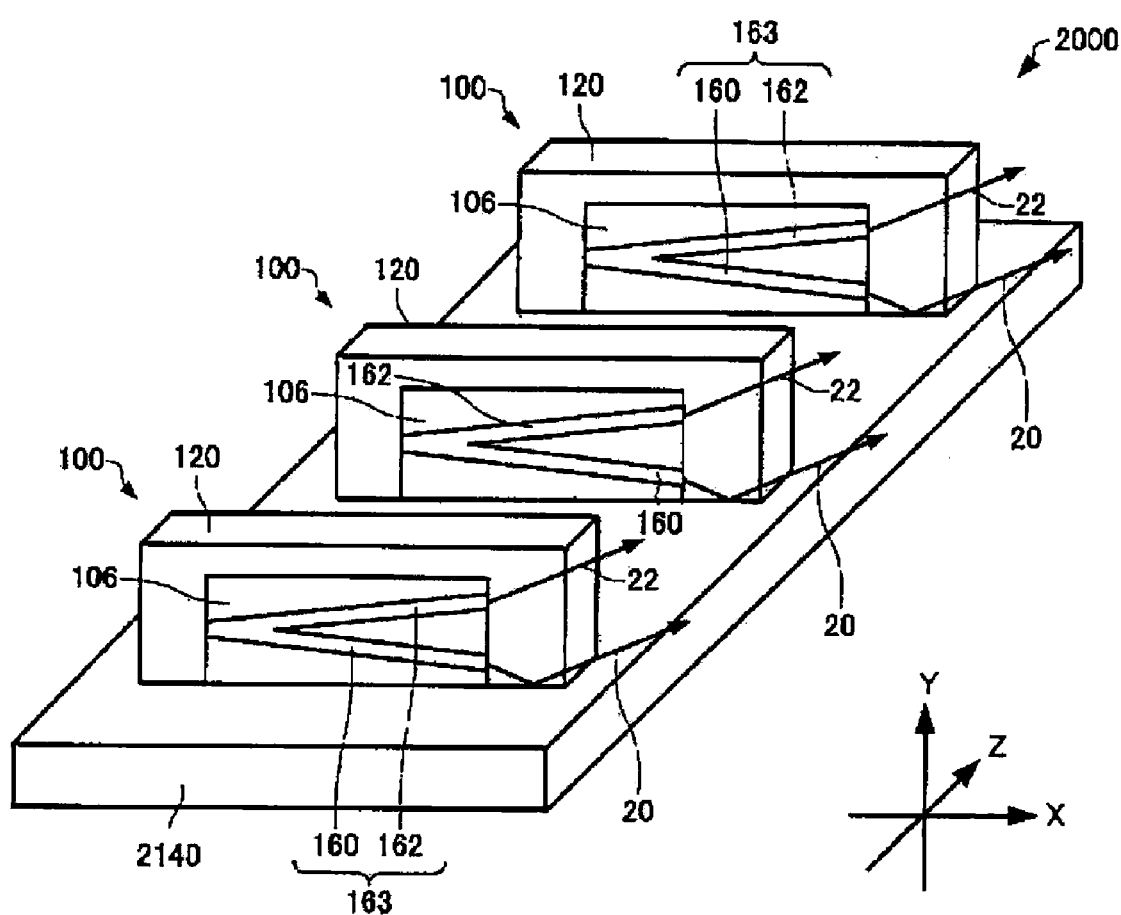
FIG. 11 is a schematic perspective view showing the light emitting device according to a modification of the second embodiment.

2.2 Layered Light Emitting Device According to a Modification of the Second Embodiment The layered light emitting device 2000 according to a modification of the second embodiment will next be described with reference to the drawings. FIG. 11 is a schematic perspective view showing the layered light emitting device 2000. The same reference numerals are used to refer to members of the layered light emitting device 2000 according to the modification of the second embodiment that have the same functions as constituent members of the layered light emitting device 1000 of the first embodiment, and no detailed description thereof will be given. The substrate 102, first cladding layer 104, second cladding layer 108, contact layer 110, first electrode 112, second electrode 114, insulation part 116, and reflective film 130 are omitted from FIG. 11 for the sake of convenience.

In the layered light emitting device 2000, the reflective part of the light emitting devices 100 arranged in the thickness direction (Z direction) of the active layers 106 is continuous, and a single reflective part 2140 is formed. The members 1022, 1024, 1026 are thereby not formed in the layered light emitting device 2000 as in the layered light emitting device 1000, and the plurality of light beams 20 and plurality of light beams 22 can propagate in the same direction or in the focusing direction while the light emitting devices 100 are layered in the Z direction.

Embodiments of the present invention are described in detail above, but it will be readily apparent to one skilled in the art that numerous modifications of the present invention are possible in a range that does not depart from the new matter and effects of the present invention. All such modifications are accordingly encompassed by the present invention.

What is claimed is:

1. A layered light emitting device comprising:
    plural light emitting devices arranged in a thickness direction of an active layer,
    each light emitting device including:
        a support part;
        a first cladding layer formed above the support part;
        an active layer formed above the first cladding layer;
        a second cladding layer formed above the active layer; and
        a reflective part formed above the support part and separated from the active layer;
    wherein
        at least a portion of the active layer constitutes a plurality of gain regions;
        each of the plurality of gain regions is provided at an angle with respect to a line normal to a first lateral surface of the active layer, from the first lateral surface to a second lateral surface of the active layer that is parallel to the first lateral surface;
        the plurality of gain regions forms at least one gain region pair;
        a first gain region that is one of the gain region pair is provided in one direction:
        a second gain region that is the other of the gain region pair is provided in another direction different from the one direction;
        at least a portion of an end surface of the first gain region, the end surface being located on the side of the second lateral surface, and at least a portion of an end surface of the second gain region, the end surface being located on the side of the second lateral surface, overlap with each other; and
    light emitted from the end surface of the first gain region, the end surface being located on the side of the first lateral surface, is reflected by the reflective part, and propagates in the same direction or in the focusing direction with light emitted from the end surface of the second gain region, the end surface being located on the side of the first lateral surface, and
    wherein
        a plurality of the gain region pairs of the light emitting device is arranged in a direction orthogonal to the thickness direction of the active layer,
        a plurality of the gain region pairs of the light emitting device is arranged in the thickness direction of the active layer, and
        electric current is fed independently to each row comprising a plurality of the gain region pairs arranged in the thickness direction of the active layer.

2. The layered light emitting device according to claim 1, wherein, within each light emitting device:
    the material of the support part and the reflective part is metal.

3. The layered light emitting device according to claim 1, wherein, within each light emitting device:
    the end surface of the first gain region, the end surface being located on the side of the second lateral surface, and the end surface of the second gain region, the end surface being located on the side of the second lateral surface, are provided to the second lateral surface.

4. The layered light emitting device according to claim 1, wherein, within each light emitting device:
    the planar shape of the first gain region and the planar shape of the second gain region are linearly symmetrical about a line normal to the first lateral surface.

5. The layered light emitting device according to claim 1, wherein, within each light emitting device:
    the end surface on the side of the first lateral surface, and the end surface on the side of the second lateral surface in each of the plurality of gain regions do not overlap with each other as viewed in a plane from the first lateral surface.

6. The layered light emitting device according to claim 1, wherein, within each light emitting device:
    at least a portion of the end surface of the first gain region, the end surface being located on the side of the second lateral surface, and at least a portion of the end surface of the second gain region, the end surface being located on the side of the second lateral surface, overlap with each other at overlapping surfaces,
    a portion of the light generated by the first gain region is reflected at the overlapping surfaces and is emitted from the end surface of the second gain region, the end surface being located on the side of the first lateral surface, and
    a portion of the light generated by the second gain region is reflected at the overlapping surfaces and is emitted from the end surface of the first gain region, the end surface being located on the side of the first lateral surface.

7. The layered light emitting device according to claim 1, wherein each light emitting device further comprises:
    a first electrode electrically connected to the first cladding layer, and
    a second electrode electrically connected to the second cladding layer.

8. A layered light emitting device comprising:
plural light emitting devices arranged in a thickness direction of an active layer,
each light emitting device including:
  a support part;
  a first cladding layer formed above the support part;
  an active layer formed above the first cladding layer;
  a second cladding layer formed above the active layer; and
  a reflective part formed above the support part and separated from the active layer;
wherein
  at least a portion of the active layer constitutes a plurality of gain regions;
  each of the plurality of gain regions is provided at an angle with respect to a line normal to a first lateral surface of the active layer, from the first lateral surface to a second lateral surface of the active layer that is parallel to the first lateral surface;
  the plurality of gain regions forms at least one gain region pair;
  a first gain region that is one of the gain region pair is provided in one direction;
  a second gain region that is the other of the gain region pair is provided in another direction different from the one direction;
  at least a portion of an end surface of the first gain region, the end surface being located on the side of the second lateral surface, and at least a portion of an end surface of the second gain region, the end surface being located on the side of the second lateral surface, overlap with each other; and
  light emitted from the end surface of the first gain region, the end surface being located on the side of the first lateral surface, is reflected by the reflective part, and propagates in the same direction or in the focusing direction with light emitted from the end surface of the second gain region, the end surface being located on the side of the first lateral surface, and
wherein
the reflective parts of the plurality of light emitting devices are continuous.

9. The layered light emitting device according to claim 8, wherein, within each light emitting device:
the material of the support part and the reflective part is metal.

10. The layered light emitting device according to claim 8, wherein, within each light emitting device:
the end surface of the first gain region, the end surface being located on the side of the second lateral surface, and the end surface of the second gain region, the end surface being located on the side of the second lateral surface, are provided to the second lateral surface.

11. The layered light emitting device according to claim 8, wherein, within each light emitting device:
the planar shape of the first gain region and the planar shape of the second gain region are linearly symmetrical about a line normal to the first lateral surface.

12. The layered light emitting device according to claim 8, wherein, within each light emitting device:
the end surface on the side of the first lateral surface, and the end surface on the side of the second lateral surface in each of the plurality of gain regions do not overlap with each other as viewed in a plane from the first lateral surface.

13. The layered light emitting device according to claim 8, wherein, within each light emitting device:
at least a portion of the end surface of the first gain region, the end surface being located on the side of the second lateral surface, and at least a portion of the end surface of the second gain region, the end surface being located on the side of the second lateral surface, overlap with each other at overlapping surfaces,
a portion of the light generated by the first gain region is reflected at the overlapping surfaces and is emitted from the end surface of the second gain region, the end surface being located on the side of the first lateral surface, and
a portion of the light generated by the second gain region is reflected at the overlapping surfaces and is emitted from the end surface of the first gain region, the end surface being located on the side of the first lateral surface.

14. The layered light emitting device according to claim 8, wherein each light emitting device further comprises:
a first electrode electrically connected to the first cladding layer, and
a second electrode electrically connected to the second cladding layer.

15. The layered light emitting device according to claim 8, wherein, within each light emitting device:
a plurality of the gain region pairs is arranged in a direction orthogonal to the thickness direction of the active layer.

* * * * *